United States Patent [19]

Allen et al.

[11] Patent Number: 4,800,152

[45] Date of Patent: Jan. 24, 1989

[54] NEGATIVE RESIST COMPOSITIONS

[75] Inventors: Robert D. Allen, San Jose, Calif.; Jean M. J. Frechet, Ottawa, Canada; Robert J. Twieg; Carlton G. Willson, both of San Jose, Calif.

[73] Assignee: International Business Machines Corporation, Armonk, N.Y.

[21] Appl. No.: 26,425

[22] Filed: Mar. 16, 1987

[51] Int. Cl.$^4$ .............................................. G03C 1/71
[52] U.S. Cl. ..................................... 430/270; 430/914; 430/919; 430/921; 430/925; 430/927; 522/31; 522/32; 522/154; 522/112; 522/129
[58] Field of Search ............... 430/270, 914, 919, 921, 430/925, 927; 522/31, 32, 154, 112, 129

[56] References Cited

U.S. PATENT DOCUMENTS

| | | | |
|---|---|---|---|
| 4,102,687 | 7/1978 | Crivello | 96/115 |
| 4,193,799 | 3/1980 | Crivello | 522/31 X |
| 4,284,707 | 8/1981 | Nagasawa et al. | 430/196 |
| 4,491,628 | 1/1985 | Ito et al. | 430/176 |
| 4,640,937 | 2/1987 | Hanyuda | 522/31 |
| 4,690,957 | 9/1987 | Fujioka et al. | 522/31 |

FOREIGN PATENT DOCUMENTS 0010897  5/1980  European Pat. Off. .

OTHER PUBLICATIONS

R. Morrison and Robert Boyd, *Organic Chemistry*, 3rd ed, Allyn and Bacon, Inc., 1973, pp. 642-643.
Pappas, S. P., *Photogeneration of Acid:* Part 6-A Review of Basic Principles for Resist Imaging Applications, Journal of Imaging Technology, vol. 11 (1985), Aug. No. 4, pp. 146-157.
Robert Morrison and Robert Boyd, *Organic Chemistry*, 3rd ed., Allyn and Bacon, Inc., 1973, pp. 642-643.
W. F. Feeley et al., Proceedings from the 7th Int'l. Technical Conference on Photopolymers, SPE 49 (1985).

*Primary Examiner*—Paul R. Michl
*Assistant Examiner*—Cynthia Hamilton
*Attorney, Agent, or Firm*—Joseph G. Walsh

[57] ABSTRACT

Heat stable, negative resist compositions are provided for use, particularly in deep ultraviolet light X-ray and electron beams. The composition comprises an acid generating onium salt photoinitiator, a source of polyfunctional activated aromatic rings and a source of polyfunctional carbonium ions, with at least one of said sources being a polymer.

2 Claims, No Drawings

NEGATIVE RESIST COMPOSITIONS

DESCRIPTION

1. Technical Field

The present invention is concerned with extremely sensitive negative resist compositions. The compositions are useful in lithography, particularly with deep ultraviolet light, electron beam or x-ray radiation. The compositions characteristically cross link by means of carbonium ion coupling to an activated aromatic moiety.

2. Background Art

W. E. Feely, et al., Proceedings from the 7th International Technical Conference on Photopolymers, SPE, 49 (1985) shows the use of melamine crosslinkers. This work does not involve the use of onium salts.

U.S. Pat. No. 4,102,687 of J. V. Crivello shows the use of onium salt photoinitiators for curing of thin film coatings. The author does not describe imaging capability, and the polymers shown are all thermosetting polymers.

U.S. Pat. No. 4,491,628 also shows the use of onium salt photoinitiators but does not involve crosslinking.

U.S. Pat. No. 4,284,707 shows a crosslinking mechanism involving the use of two copolymers. No onium salts are involved.

DISCLOSURE OF THE INVENTION

A new method of photo crosslinking polymers has been found. The method results in very high performance negative resists. The method is based on acid generated carbonium ion electrophiles which readily react with activated aromatic compounds. By these methods there are obtained high resolution negative tone images. These materials have unusually high contrast and as far as we are aware, they are the most sensitive resists known to date.

The present invention provides heat stable negative resist compositions comprising an acid generating onium salt photoinitiator, a source of polyfunctional activated aromatic rings, and a latent source of polyfunctional carbonium ions, with at least one of said sources being a polymer. When the expression "activated aromatic rings" is used, it is intended to have the ordinary meaning, namely that the ring is substituted with an electron releasing group, for example, a hydroxyl group, methoxyl group or groups traditionally referred to as "ortho-para directing".

The present invention comprises many variations of the two types of polyfunctionality. In one variation of the present invention, the two types are in a single copolymer. In another variation, they are in two different polymers. In still another variation, one type of polyfunctionality is in a polymer, and the other type of polyfunctionality is in a polyfunctional monomer. These variations are all encompassed by the language above which states that at least one polymer must be present as a source of polyfunctionality.

The negative resist compositions of the present invention are heat stable, i.e. the compositions are capable of being stored for a long time before use. This good shelf life is due to the fact that the compositions of the present invention are not essentially thermosetting.

During use of the compositions of the present invention, the onium salt, when subjected to radiation, yields acid. The acid reacts with one of the sources of polyfunctionality to create carbonium ions. The carbonium ions then react with the activated aromatic rings to produce crosslinking. The reaction between the carbonium ions and the activated aromatic rings also generates in the radiated area catalytically effective amounts of acid to produce a chain reaction yielding very increased sensitivity.

Acid generating onium salt photoinitiators are very well known in the art. Useful materials include, for example, diaryliodonium and triarylsulfonium salts. The preferred gegenanions are the complex metal halides, such as tetrafluoroborate, hexafluoroantimonate, trifluoromethanesulfonate, hexafluoroarsenate and hexafluorophosphate.

A preferred example of a useful source of polyfunctional activated aromatic rings is p-hydroxystyrene or its precursor poly(t-butyloxycarbonyloxystyrene). The poly(t-butyloxycarbonyloxystyrene) undergoes conversion to poly(p-hydroxystyrene) under the influence of the photogenerated acid (U.S. Pat. No. 4,991,628). The photogenerated acid thus serves both to modify the activated moieties and generate carbonium ions from the appropriate precursor. A preferred example of a source of polyfunctional carbonium ions is poly(vinylbenzyl acetate). Poly(vinylbenzyl acetate) and its analogs serve to produce benzyl carbonium ions upon reaction with the photogenerated acid. A very useful and preferred monomeric source of polyfunctionality carbonium ions is the material trisacetoxy mesitylene (TAM). A preferred source of polyfunctional, monomeric, activated aromatics is bisphenol A, biphenol, the methyl ethers of these compounds and analogs.

It is apparent that the present invention lends itself to use in systems containing either two components or three components. The 2-component system contains, besides the acid generating onium salt photoinitiator, a dual functioning copolymer consisting of monomer units with pendant activated aromatic residues and monomer units with pendant carbonium ion precursors. Low dosage of deep ultraviolet or electron beam radiation generates catalytic amounts of strong acid, which reacts with functionalities on the polymer to form carbonium ions along the polymer chain. These polymer bound electrophiles, in turn, attack suitably activated aromatic rings also present in the copolymer structure. The electrophilic aromatic substitution reactions involved in this mechanism act to regenerate acid to continue the chain reaction, which in combination with the crosslinking, confers very high sensitivity to these resists.

Alternatively 3-component systems, wherein the activated aromatic polymer, the carbonium ion generator, and the onium salt, are three separate components, offer far greater design flexibility. For example, a desirable polymer property, such as base developability, high Tg, etch resistance, etc., may be provided by the polymer chosen, without complications arising from dilution or averaging effects inherent to copolymer systems. Thus, a three-component system can be based on a (1) polymer bearing activated aromatic groups, (2) a multifunctional carbonium ion generator, and (3) an onium salt. Alternatively it can be based on (1) a polymer bearing carbonium ion generator, (2) a multifunctional activated aromatic compound, and (3) an onium salt.

It is clearly possible to incorporate organometallic elements into one or more of the components of a resist formulation of the sort described above. When, for example, greater than 3% by weight of Si or Sn is incorporated, the resulting negative tone images are rendered resistant to oxygen dry etching. Hence, such materials are applicable to bilayer image formation using oxygen reactive ion etching as the image transfer process.

When used as resists, the compositions of the present invention are first coated on a substrate, for example by spin coating from a solvent. The coated film is then baked and exposed in an imagewise manner to radiation, for example through a mask. In the radiated areas, but not in the non-radiated areas, catalytic amounts of acid are generated, which reacts with functionalities on the polymer to form carbonium ions, which react with the aromatic rings. This reaction generates acid to continue the chain reaction.

The following Examples are given solely for purposes of illustration and are not to be considered limitations of the present invention, many variations of which are possible without departing from the spirit or scope thereof.

EXAMPLE I

A 2-Component Resist System

A copolymer of t-butyloxycarbonyloxystyrene and vinyl benzyl acetate (75/25) was synthesized by free radical polymerization in toluene. This high molecular weight copolymer consists of both a carbonium ion generator (benzyl acetate) and an activated aromatic (t-BOC protected phenolic).

The copolymer was formulated with triphenyl sulfonium hexafluoroantimonate (90/10, respectively) and spun from 2-butanone. High resolution fine lines were contact printed with doses as low as 1.0 mJ/cm$^2$ of 254nm filtered light. Acetone spray development was used. Lack of swelling clearly shows the high crosslink density achieved at this low dose and moderate bake temperature. It should be noted that higher sensitivity can easily begained by postbaking at a higher temperature. For example, this resist system, when postbaked at 135 degrees C. for 30 seconds has a sensitivity of 0.3 mJ/cm$^2$ with a contrast approaching 10. This, to our knowledge, is the most sensitive, highest contrast resist ever reported.

EXAMPLE II

A 3-Component System

Base soluble resist formulation consisting of 80% p-hydroxystyrene, 10% tris-acetoxymesitylene, and 10% triphenyl sulfonium hexafluoro antimonate was spun from cyclohexanone to give 0.5 micron films having adequate transmittance for imaging at 254nm. At 135 degrees C. postbake, a 1.1 mJ/cm$^2$ resist with a contrast value greater than 10 results. This contrast value is several times that of the highest contrast negative resists reported. The combination of high contrast and base developability affords a very high resolution non-swelling resist. 1.0 micron spaces were developed in an exposed pad of negative resist at 5 mJ/cm$^2$. Development was performed by immersion in a dilute base solution for 3–4 minutes, followed by a water rinse. This resist formulation has an e-beam sensitivity of greater than 0.5 uCoul./cm$^2$ at 20 keV based on classical definitions of sensitivity.

As in the two component system, ultimate sensitivity is a function of many controllable variables. Thus the desired sensitivity may readily be designed into the system. An example of the design flexibility of the 3-component approach is the use of a polymeric carbonium ion generator e.g. poly(vinylbenzyl acetate), a low molecular weight, multifunctional activated aromatic (e.g. phenol), and an onium salt photoinitiator.

EXAMPLE III

A resist formulation containing a polymeric carbonium ion generator poly(vinylbenzyl acetate) (80%), a monomeric multifunctional source of activated aromatic bisphenol A (10%) and the photoinitiator triphenyl sulfonium hexafluoroantimonate (10%) was spun from cyclohexanone and baked at 135 degrees C. to give one micron thick resist films. Imagewise exposure, baking at 130 degrees/90 sec. followed by acetone development revealed sensitivities below 5 mJ/cm$^2$.

We claim:

1. A heat stable negative resist composition comprising an onion salt photoinitiator, poly(vinylbenzyl acetate) and bisphenol-A.

2. A heat stable negative resist composition comprising an acid generating onium salt, trisacetoxy mesitylene and a polymer which contains multiple activated aromatic rings, said polymer being chosen so that following irradiation it reacts with said triacetoxy mesitylene to form crosslinking and also to generate acid.

* * * * *

UNITED STATES PATENT AND TRADEMARK OFFICE
CERTIFICATE OF CORRECTION

PATENT NO. : 4,800,152

DATED : January 24, 1989

INVENTOR(S) : Robert D. Allen et al

It is certified that error appears in the above-identified patent and that said Letters Patent is hereby corrected as shown below:

IN THE CLAIMS

Column 4, line 42, "onion" should be --onium--.

Signed and Sealed this

Sixteenth Day of January, 1990

Attest:

JEFFREY M. SAMUELS

*Attesting Officer*     *Acting Commissioner of Patents and Trademarks*